United States Patent
Yi et al.

(10) Patent No.: US 9,051,454 B2
(45) Date of Patent: Jun. 9, 2015

(54) HEAT-RESISTANT POLYAMIDE COMPOSITION AND APPLICATION THEREOF

(75) Inventors: Qingfeng Yi, Guangdong (CN); Sujun Jiang, Guangdong (CN); Jiehong Mai, Guangdong (CN); Zhingqiang Jiang, Guangdong (CN); Jieming Long, Guangdong (CN); Xia Yan, Guangdong (CN); Kaijun Ning, Guangdong (CN); Tongmin Cai, Guangdong (CN)

(73) Assignees: KINGFA SCI & TECH CO. LTD. (CN); SHANGHAI KINGFA TECHNOLOGY DEVELOPMENT CO., LTD (CN)

( * ) Notice: Subject to any disclaimer, the term of this patent is extended or adjusted under 35 U.S.C. 154(b) by 0 days.

(21) Appl. No.: 14/351,127

(22) PCT Filed: Dec. 8, 2011

(86) PCT No.: PCT/CN2011/002050
§ 371 (c)(1),
(2), (4) Date: Apr. 10, 2014

(87) PCT Pub. No.: WO2013/053086
PCT Pub. Date: Apr. 18, 2013

(65) Prior Publication Data
US 2014/0303293 A1 Oct. 9, 2014

(30) Foreign Application Priority Data
Oct. 10, 2011 (CN) .......................... 2011 1 0304713

(51) Int. Cl.
| | | |
|---|---|---|
| C08K 3/00 | (2006.01) | |
| C08K 3/02 | (2006.01) | |
| C08K 3/18 | (2006.01) | |
| C08K 3/22 | (2006.01) | |
| C08K 3/26 | (2006.01) | |
| C08K 3/40 | (2006.01) | |
| C08K 5/00 | (2006.01) | |
| C08K 5/04 | (2006.01) | |
| C08K 5/07 | (2006.01) | |
| C08K 5/13 | (2006.01) | |
| C08K 5/36 | (2006.01) | |
| C08K 5/52 | (2006.01) | |
| C08K 13/04 | (2006.01) | |
| C08L 77/06 | (2006.01) | |
| H01L 33/60 | (2010.01) | |

(52) U.S. Cl.
CPC .................. C08K 13/04 (2013.01); C08L 77/06 (2013.01); H01L 33/60 (2013.01); *C08K 2003/2241* (2013.01); *C08K 2003/2296* (2013.01)

(58) Field of Classification Search
CPC ........ A01B 12/006; C08K 5/07; C08K 5/101; C08K 5/3475; C08K 7/14; C08K 13/04; C08K 2003/2237; C08K 2003/2241; C08K 2003/2296; C08K 2003/3045; C08K 2003/38; C08K 3/22; C08L 77/06; H01L 33/60
USPC ........... 524/91, 291, 359, 404, 423, 425, 432, 524/434, 494, 80, 140, 282, 323, 394, 400, 524/413, 456, 514, 538, 607
See application file for complete search history.

(56) References Cited

U.S. PATENT DOCUMENTS

| | | | |
|---|---|---|---|
| 5,140,098 A | 8/1992 | Pipper | |
| 6,855,755 B1 * | 2/2005 | Yamamiya et al. | ........... 524/106 |
| 2005/0197452 A1 * | 9/2005 | Bersted et al. | ................. 525/66 |

FOREIGN PATENT DOCUMENTS

| | | |
|---|---|---|
| CN | 101456949 | 6/2009 |
| CN | 101870810 | 10/2010 |
| CN | 102372921 A | 3/2012 |
| EP | 2703449 A1 | 3/2014 |
| JP | 63161021 | 7/1988 |

OTHER PUBLICATIONS

International Search Report of PCT/CN2011/002050, mailed Jun. 14, 2012.

* cited by examiner

*Primary Examiner* — Kriellion Sanders
(74) *Attorney, Agent, or Firm* — Lucas & Mercanti, LLP; Peter J. Phillips

(57) ABSTRACT

The present invention discloses a heat-resistant polyamide composition and application thereof. The composition comprises the following components in percentage by weight: 40% to 90% of heat-resistant polyamide resin, 5% to 35% of mineral fiber A, 0 to 35% of mineral filler B, 0.1% to 1% of light stabilizer, 0.1% to 1% of flow modifier and 0.1% to 1% of antioxidant. In the present invention, heat-resistant polyamide resin with the ratio of amine-terminated group and carboxyl-terminated group between 0.1 and 0.8 is selected to be matched with deformed glass fibers with an aspect ratio of 2 to 6, the mineral filler B and the flow modifier to obtain the heat-resistant polyamide composition. The heat-resistant polyamide composition not only has high initial whiteness, high reflectivity and excellent heat resistance, but also has good moldability and good dimensional stability; therefore, the heat-resistant polyamide composition is capable of being applied for preparing the reflecting supports for such light sources as LCD backlight of portable phones, computers, televisions and the like, as well as headlights of automotive vehicles, instrument panels and lighting appliances, etc.

10 Claims, No Drawings

US 9,051,454 B2

HEAT-RESISTANT POLYAMIDE COMPOSITION AND APPLICATION THEREOF

The present application is a 371 of International application PCT/CN2011/002050, filed Dec. 8, 2011, which claims priority of CN 201110304713.3, filed Oct. 10, 2011, which has issued as CN Patent No 102372921B on May 8, 2013, the priority of these applications is hereby claimed and these applications are incorporated herein by reference.

FIELD OF THE PRESENT INVENTION

The present invention relate to a heat-resistant polyimide composition and application thereof, and in particular, to a heat-resistant polyamide composition applicable to a LED (Light-Emitting Diode) reflector.

BACKGROUND OF THE RELATED ART

An LED is a light-emitting device formed by carrying an electroluminescent semiconductor module on a substrate (a reflector) and encapsulating with epoxy resin or silica gel and the like. The LED has various extremely excellent characteristics, such as small volume and light weight, so as to be applied for a variety of lighting equipments. In addition, the service life can be up to 100,000 hours; the color is vivid and conspicuous, showing excellent visual performance and low power consumption. To obtain the advantages above-mentioned, the reflector not only can be expected to be shaped precisely, but also has good heat resistance. Stable and high reflectivity is especially indispensable for the performance of reflected light, and that yellowing and reflectivity reducing due to heating of the LED reflector must be negligible after assembling and soldering processes. In prior art, for example, Chinese patent CN02826032.5 discloses a resin composition for a reflecting plate, which is formed by adding potassium carbonate fiber or wollastonite into an aromatic polyamide resin and adding TiO2 if necessary. The resin composition has good heat resistance and dimension stability to some extent, but with the disadvantages of insufficient long-term thermal aging resistance and obviously reduced reflectivity. U.S. Patent US 2008167404A1 discloses an aromatic polyamide composition and articles manufactured therefrom, wherein the aromatic polyamide composition comprises more than 5 wt % of at least one crystalline silicate, more than 2 wt % of at least one white pigment, and more than 1 wt % of at least one optionally functionalized olefin copolymer and aromatic polyamide, leading to the polyamide compositions with insufficient initial whiteness and reflectivity. Chinese patent CN 200680011812.X discloses a resin composition for a reflecting plate and a reflecting plate itself, wherein the resin composition for the reflecting plate comprises 30-80 wt % of polyamide, 10-60 wt % of an inorganic filler and 5-50 wt % of a white pigment. The resin composition presents itself as a combination of good mechanical strength and high reflectivity. But the molding shrinkage and linear expansivity are large; therefore, the dimensional stability is poor. World patent WO 03/085029 discloses a polyamide resin for an LED reflector by adopting 1,9-diaminononane as diamine component. However, the polyamide resin fails to avoid reducing the reflectivity sufficiently due to heating during assembling and soldering processes of the LED

SUMMARY OF THE PRESENT INVENTION

For the existing problems above-mentioned, the purpose of the present invention is to provide a heat-resistant polyamide composition, which has the advantages of high whiteness, high reflectivity, excellent moldability, low molding shrinkage and good dimensional stability.

To realize the purpose above-mentioned, the present invention adopts the following technical proposal:

A heat-resistant polyamide composition, comprising the following components in percentage by weight:
40% to 90% of heat-resistant polyamide resin
5% to 35% of mineral fiber A
0 to 35% of mineral filler B
0.1% to 1% of light stabilizer
0.1% to 1% of flow modifier
and 0.1% to 1% of antioxidant, wherein the heat-resistant polyamide resin comprises a dicarboxylic acid component unit a and a diamine component unit b. The dicarboxylic acid component comprises aromatic dicarboxylic acid or partial lade dicarboxylic acid can be replaced by aliphatic dicarboxylic acid, and the content of the dicarboxylic acid component in the heat-resistant polyamide resin is more than 25 mol %; the diamine component comprises a linear aliphatic diamine component with carbon numbers of 4 to 20 and/or an aliphatic diamine component with branched chain and/or an alicyclic diamine component; and the ratio of amino end group and carboxyl end group is controlled between 0.1 and 0.8.

In the heat-resistant polyamide composition above-mentioned, the range of the following components in percentage by weight is preferred:
60% to 80% of heat-resistant polyamide resin
10% to 30% of mineral fiber A
5% to 20% of mineral filler B
0.1% to 0.5% of light stabilizer
0.1% to 0.5% of flow modifier
and 0.1% to 0.5% of antioxidant.

The heat-resistant polyamide resin above-mentioned comprises a dicarboxylic acid component unit a and a diamine component unit b. The dicarboxylic acid component unit a comprises aromatic dicarboxylic acids, such as terephthalic acid, isophthalic acid, 1,4-phenylene dioxo-oxalic acid, 1.3-phenylene dioxo-oxalic acid, diphenyl methane-4,4'-dicarboxylic acid; in addition, aliphatic dicarboxylic acids can also be included, such as malonic acid, dimethyl malonic acid, succinic acid, glutarate, adipic acid, pimelic acid, 2,2-dimethyl glutarate, 3,3-diethyl succinic acid, azelaic acid, sebacic acid and suberic acid.

The diamine component unit b comprises a linear aliphatic diamine component with carbon numbers of 4 to 20 and/or an aliphatic diamine component with branched chain and/or alicyclic diamine component; the linear aliphatic diamine component comprises 1,4-butane diamine 1,6-hexane diamine, 1,8-octanediamine, 1,9-nonane diamine, 1,10-decamethylene diamine, 1,11-undecylenic diamine or 1,12-dodecyl diamine; the branched aliphatic diamine component comprises 2-methyl-1,5-pentamethylene diamine, 3-methyl-1,5-pentamethylene diamine, 2,4-dimethyl-1,6-hexane diamine 2,2,4-trimethyl-1,6-hexane diamine, 2,4,4-trimethyl-1,6-hexane diamine, 2-methyl-1,8-octane diamine or 5-methyl-1,9-nonane diamine; and the alicyclic diamine component comprises cyclohexane diamine, methylcyclohexane diamine, or 4,4'-diamino-dicyclohexyl methane.

The relative viscosity of the heat-resistant polyamide resin above-mentioned is 2.0-3.5 and the melting point is at least 280° C.

The heat-resistant polyamide resin above-mentioned can be manufactured by condensation polymerization in the prior art; for example, the dicarboxylic acid component unit a and the diamine component unit b are heated to obtain prepolymer under a nitrogen condition, and after drying under vacuum the heat-resistant polyamide resin produced through solid phase polycondensation under nitrogen.

The ratio of amino end group and carboxyl end group of the heat-resistant polyamide resin prepared must be controlled between 0.1 and 0.8, which can be adjusted appropriately through monitoring the temperature of resin polymerization as well as proper selection of ratio and type of the dicarboxylic acid component unit a and the diamine component unit b and end-capping reagents (such as benzaldehyde and derivatives thereof) in the preparation process.

The mineral fiber A above-mentioned refers to circular cross-section glass fiber, non-circular cross-section glass fiber, wollastonite fibers, boric fiber, potassium titanate fiber, calcium carbonate crystal whisker or barium sulfate crystal whisker; the diameter of the circular cross-section chopped glass fiber is 11 to 13 μm; and the non-circular cross-section glass fiber comprises a rectangular cross-section glass fiber, oval cross-section glass fiber and cocoon-shaped cross-section glass fiber. The mineral fiber A disclosed by the present invention is preferably non-circular cross-section glass fiber with an aspect ratio of 2 to 6.

The mineral filler B above-mentioned refers to titanium oxide or nano-zinc oxide, the granule size of the titanium oxide is 0.2 to 0.3 μm, and the granule size of the nano-zinc oxide is 20 to 80 nm and the purity of the nano-zinc oxide is greater than or equal to 98%.

The light stabilizer above-mentioned is one or mixture selected from benzophenone compounds, salicylate compounds, or benzotriazole compounds.

The flow modifier above-mentioned is one or mixture selected from fluorine-containing polymers, PE waxes, EBS, montanic sodium or calcium salts, or hyperbranched polymers.

The antioxidant is one or mixture selected from hindered phenolic antioxidants, phosphate antioxidants, or thioester antioxidants.

The heat-resistant polyamide composition above-mentioned can be produced as follows: firstly, the heat-resistant polyamide resin was uniformly mixed with the antioxidant, the light stabilizer, the flow modifier and the mineral filler B according to the scheduled percentage, then the mixtures were added into an extruder from the main feeding port of a twin-screw extruder. Then, mineral fiber A was fed from the side feeder of extruder. Finally, the material strand was extruded and chopped as granules. The processing temperature is net within the range of 300 to 340° C. from the rear to the front of extruder.

The heat-resistant polyamide composition prepared by the method above-mentioned is capable of being used for producing molded articles for a variety of applications through molding methods such as injection, extrusion or blow molding and other known molding methods.

The heat-resistant polyamide composition above-mentioned is capable of being applied for preparing the reflectors for such light sources as LCD backlight of portable phones, computers, televisions and the like, as well as headlights of automotive vehicles, instrument panels and lighting appliances, etc.

Compared with the prior art, the present invention has the following advantages:

1) The ratio of the amino end group and carboxyl end group of the polyamide resin in the heat-resistant polyamide composition disclosed by this invention is adjusted within the special range, effectively preventing the heat-resistant polyamide resin composition from yellowing and reflectivity reducing after the assembling and fellow soldering processes; therefore, the heat-resistant polyamide composition has high initial whiteness, high reflectivity and excellent heat resistance;

2) The processability of the heat-resistant polyamide composition disclosed by the present invention is improved greatly by using special glass fibers and the flow modifier, and the moldability is excellent, and the molding shrinkage is low, and the dimensional stability is good.

DETAILED DESCRIPTIONS OF THE EXAMPLE EMBODIMENTS

The present invention shall be illustrated by the detailed description of the example embodiments hereunder, but not limited within these. In the example embodiments and the comparative examples, determination and evaluation of properties were tested by methods below.

[Quantity of Amino End Group]

0.5 g polymer, 45 ml phenol and 3 ml absolute methanol are added into a 100 ml conical flask putting on an electric heat plate to heat this mixture to reflux until the sample dissolves completely. Titrate the obtained sample solution with 0.01N hydrochloric solution to determinate the quantity of the amine-terminated group by using thymol blue as an indicator.

[Quantity of Carboxyl End Group]

0.5 g polymer and 50 ml o-cresol are added into a 100 ml conical flask putting on an electric heat plate to heat this mixture to reflux until the sample dissolves completely, and 400 μl formaldehyde solution are then added after cooling. Titrate the obtained sample solution with 0.1N formaldehyde solution with potassium hydroxide to determinate the quantity of the carboxyl-terminated group.

[Relative Viscosity η r]

0.5 g polyamide resin is dissolved in 50 ml 96.5% concentrated sulfuric acid solution, and defluxion time of the solution through an Ubbelohde viscosity meter at 25° C.±0.05° C. is marked as t1; in addition, the blank defluxion time of 96.5% concentrated sulfuric acid solution through the Ubbelohde viscosity meter is marked as t2. Relative viscosity η r can be calculated by this formula:

$$\eta r = t1/t2$$

[Melting Point Tm]

Using DSC-7 manufactured by PE company. Firstly, rapidly heat the sample to 330° C. and keep at the temperature for 5 min, and then cool at a speed of 10° C./min to 50° C., and after that heat at a speed of 10° C./min to 330° C. The peak of the endothermic curve is defined as the melting point Tm.

[Melt Flow Evaluation]

After drying at 120° C. for 4 h, the heat resistant polyamide granule was molded through an injection molding machine with a spiral mold at a barrel temperature of 320° C. and a mold temperature of 120° C., resulting in a spiral sample with width of 5 mm and thickness of 2.5 mm, the length of which can betested to characterize the melt flow.

[Mechanical Properties Test]

The mechanical properties are measured according to ISO standards; tensile and flexural performance are conducted by an Instron electronic universal testing machine; and impact strength are conducted by a Zwick cantilever impact testing machine.

[Dimensional Stability]

After drying at 120° C. for 4 h, the heat resistant polyamide granules are molded by an injection molding machine to get a specimen 64×64×1 min at the barrel temperature of 320° C. and the mold temperature of 120° C. The length of the test piece [L0] can be obtained after drying completely, in contrast, another length [L1] can be obtained after immersion of test specimens into water at 23° C. for 24 h Dimensional stability (%)=[(L1−L0)/L0]×100

[Optical Performance Test]

A Color-Eye 7000A spectrophotometer is used for optical performance test to obtain the values of reflectivity, L, a and b, and Hunter whiteness W can be achieved through calculation.

$W=100-[(100-L)2+a2+b2]1/2$

[Heat-Resistance and Color-Change Test

64×64×1 mm specimen molded as those used in a dimensional stability test is subjected to an infrared reflow soldering machine adopted widely in surface mount technology (SMT), and the SMT peak temperature is 265° C. The processed specimen through SMT is tested by the Color-Eye 7000A spectrophotometer to obtain the reflectivity and the Hunter whiteness W.

The ratio of the amine end group and the carboxyl end group of the heat-resistant polyamide resin shall be controlled between 0.1 and 0.8 by controlling the temperature of resin polymerization, and adjusting the forming ratio and type of the dicarboxylic acid component unit a and the diamine component unit b as well as the end-capping reagent.

According to the ratio of various components as shown in table 1, uniformly mix the heat-resistant polyamide resin with the antioxidant, the light stabilizer, the flow modifier and the mineral filler B to get an mixture; then add this mixture into the extruder from the main feeding port of the twin-screw extruder; charge the mineral fiber A from the side of the extruder, wherein the processing temperature is set within the range of 300 to 340° C.; and finally, the material strand is extruded and chopped as granules. The results of the final evaluation of various physical properties of the obtained resin composition are shown in table 1.

TABLE 1

Testing Results of Various Examples and Comparative Examples

|  | Example 1 | Example 2 | Example 3 | Example 4 | Comparative Example 1 | Comparative Example 2 | Comparative Example 3 |
|---|---|---|---|---|---|---|---|
| Heat-resisting polyamide resin wt % | 60 | 60 | 60 | 70 | 60 | 60 | 60 |
| [NH2] mmol/kg | 75 | 65 | 60 | 25 | 75 | 93 | 58 |
| [COOH] mmol/kg | 94 | 92 | 151 | 200 | 94 | 75 | 45 |
| [NH2]/[COOH] | 0.80 | 0.71 | 0.40 | 0.13 | 0.80 | 1.24 | 1.29 |
| Melting point Tm (° C.) | 320 | 325 | 316 | 305 | 320 | 315 | 318 |
| Relative viscosity ηr | 2.6 | 2.8 | 2.2 | 2.0 | 2.6 | 2.5 | 2.7 |
| Mineral fiber A wt % | 20 | 20 | 20 | 15 | 20 | 20 | 20 |
| Mineral fiber B wt % | 19.2 | 19.2 | 19.2 | 14.2 | 19.2 | 19.2 | 19.2 |
| Light stabilizer wt % | 0.1 | 0.1 | 0.1 | 0.1 | 0.1 | 0.1 | 0.1 |
| Flow modifier wt % | 0.5 | 0.5 | 0.5 | 0.5 | 0.5 | 0.5 | 0.5 |
| Antioxidant wt % | 0.2 | 0.2 | 0.2 | 0.2 | 0.2 | 0.2 | 0.2 |
| Tensile strength MPa | 115 | 113 | 116 | 108 | 117 | 112 | 114 |
| Flexural strength MPa | 159 | 150 | 161 | 145 | 165 | 155 | 160 |
| Flexural modulus MPa | 9000 | 8600 | 8700 | 8500 | 9100 | 8600 | 8300 |
| Notch impact strength kJ/m2 | 5.5 | 6.1 | 5.2 | 6.5 | 5.4 | 6.6 | 5.8 |
| Spiral length of 2.5 mm (320° C. mm) | 520 | 500 | 540 | 540 | 440 | 520 | 540 |
| Dimensional stability (%) | 0.05 | 0.03 | 0.06 | 0.08 | 0.18 | 0.09 | 0.07 |
| Initial Hunter whiteness W | 97.1 | 97.5 | 96.9 | 97.2 | 96.5 | 95.6 | 95.8 |
| Initial reflectivity (460 nm %) | 96.3 | 96.8 | 96.5 | 95.9 | 96.1 | 95.1 | 94.8 |
| Hunter whiteness W subjected to SMT for 3 times | 95.9 | 96.1 | 95.7 | 96 | 95.4 | 90.1 | 89.5 |
| Reflectivity subjected to SMT for 3 times (460 nm %) | 92.1 | 92.8 | 93.1 | 92.6 | 91.9 | 85.2 | 84.6 |

[Preparation of heat-resistant polyamide resin]: under the nitrogen condition, add 3323 g (20 mol) terephthalic acid, 3446 g (20 mol) decamethulene diamine, 73.27 g (0.6 mol) benzoic acid, 6.77 g (measured as 0.1 wt % based on the gross weight of the raw materials) sodium hypophosphite and 2.2 L deionized water into a 20 L pressure vessel equipped with a magnetic coupling stirrer, a condenser pipe, a gas phase port, a charging port and a pressure explosion-proof port, and heat after nitrogen purging; heat to 170° C. while stirring to start dehydrating, and then heat to 220° C. after dehydrating, stir the reaction mixture for 1 h at 220° C., and heat to 230° C. while stirring; keep on reacting for 2 h under the condition of 230° C. and 2.5 MPa, discharge after reaction to obtain the prepolymer with the relative viscosity as 1.08; perform the prepolymer at 80° C. for 24 h under a vacuum drying condition, and then conduct solid phase polymerization for 10 h under nitrogen at 260° C. to obtain the heat-resisting polyamide resin, wherein the melting point is 320° C., the relative viscosity is 2.6, the content of the amine-terminated group is 75 mmol/kg; the content of the carboxyl-terminated group is 94 mmol/kg; and the [amine group]/[carboxyl group] is 0.8.

From the view of the testing results of the examples above-mentioned and the comparative examples, the heat-resistant polyimide resin composition of this invention turns yellow little and the reflectivity is reduced little after the assembling and reflow soldering processes; thus, the heat-resistant polyamide composition of this invention owns not only high initial whiteness, high initial reflectivity and excellent heat resistance but also improved dimensional stability and processability.

The invention claimed is:

1. A heat-resistant polyamide composition, which is characterized by comprising the following components in percentage by weight:
   40% to 90% of heat-resisting polyamide resin,
   5% to 35% of mineral fiber A,
   14.2 to 35% of mineral filler B,
   0.1% to 1% of light stabilizer,
   0.1% to 1% of flow modifier,
   and 0.1% to 1% of antioxidant, wherein the heat-resistant polyamide resin comprises a dicarboxylic acid component unit a and a diamine component unit b, the dicarboxylic acid component a comprises aromatic dicarboxylic acids, and the content of the dicarboxylic acids component in the heat-resistant polyamide resin is more than 25 mol %; the diamine component b comprises a linear aliphatic diamine component with carbon numbers of 4 to 20 and/or an aliphatic diamine component with branched chain and/or an alicyclic diamine component; and the ratio of amine-terminated group and carboxyl-terminated group is controlled between 0.1 and 0.8.

2. The heat-resistant polyamide composition according to claim 1, wherein the heat-resistant polyamide composition comprises the following components in percentage by weight:

60% to 80% of heat-resistant polyamide resin,
10% to 30% of mineral fiber A,
14.2% to 20% of mineral filler B,
0.1% to 0.5% of light stabilizer,
0.1% to 0.5% of flow modifier,
and 0.1% to 0.5% of antioxidizer.

3. The heat-resistant polyamide composition according to claim 1 or 2, wherein the heat-resistant polyamide resin above-mentioned refers to a polyamide resin, the relative viscosity of which is within the range of 2.0 to 3.5 and the melting point of which is at least 280° C.

4. The heat-resistant polyamide composition according to claim 1 or 2, wherein the mineral fiber A above-mentioned refers to circular cross-section glass fiber, non-circular cross-section glass fiber, wollastonite fiber, boric fiber, potassium titanate fiber, calcium carbonate crystal whisker or barium sulfate crystal whisker.

5. The heat-resistant polyamide composition according to claim 4, wherein the mineral fiber A is the non-circular cross-section glass fiber with an aspect ratio of 2 to 6.

6. The heat-resistant polyamide composition according to claim 1 or 2, wherein the mineral filler B above-mentioned refers to titanium oxide or nano-zinc oxide, the granule size of the titanium oxide is 0.2 to 0.3 µm, and the granule size of the nano-zinc oxide is 20 to 80 nm and the purity of the nano-zinc oxide is greater than or equal to 98%.

7. The heat-resistant polyamide composition according to claim 1 or 2, wherein the light stabilizer is one or mixtures selected from benzophenone compounds, salicylate compounds or benzotriazole compounds.

8. The heat-resistant polyamide composition according to claim 1 or 2, wherein the flow modifier is one or mixtures selected from fluorine-containing polymers, PE waxes, EBS, montanic sodium or calcium salts, or hyperbranched polymers.

9. The heat-resistant polyamide composition according to claim 1 or 2, wherein the antioxidant is one or mixtures selected from hindered phenolic antioxidants, phosphate antioxidants, or thioester antioxidants.

10. The heat-resistant polyamide composition according to claim 1 or 2, is used for preparing a reflector for LED.

* * * * *